United States Patent
Su et al.

(10) Patent No.: US 9,386,692 B2
(45) Date of Patent: Jul. 5, 2016

(54) POWER SUPPLY PATH STRUCTURE OF FLEXIBLE CIRCUIT BOARD

(71) Applicant: ADVANCED FLEXIBLE CIRCUITS CO., LTD., Taoyuan County (TW)

(72) Inventors: Kuo-Fu Su, Taoyuan County (TW); Chih-Heng Chuo, Taoyuan County (TW); Gwun-Jin Lin, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 0 days.

(21) Appl. No.: 14/704,196

(22) Filed: May 5, 2015

(65) Prior Publication Data

US 2015/0359083 A1   Dec. 10, 2015

(30) Foreign Application Priority Data

Jun. 9, 2014   (TW) .............................. 103119829 A

(51) Int. Cl.
*H05K 1/00* (2006.01)
*H05K 1/02* (2006.01)
*H05K 3/36* (2006.01)
*H05K 1/11* (2006.01)

(52) U.S. Cl.
CPC ................ *H05K 1/028* (2013.01); *H05K 3/361* (2013.01); *H05K 1/118* (2013.01); *H05K 2201/0394* (2013.01); *H05K 2201/041* (2013.01); *H05K 2201/055* (2013.01); *H05K 2201/09481* (2013.01)

(58) Field of Classification Search
CPC ............. H05K 1/00; H05K 1/02; H05K 1/11; H05K 1/18; H05K 1/28; H05K 3/00; H05K 3/32; H05K 3/36; H01L 23/02; H01L 23/12; H01L 23/14; H01L 23/16; H01L 23/34; H01L 23/48

USPC .......... 174/254–256, 258, 260, 350; 361/749, 361/771, 777, 803; 216/18, 20; 156/150, 156/250, 252, 253, 257

See application file for complete search history.

(56) References Cited

U.S. PATENT DOCUMENTS

| 4,715,928 | A | * | 12/1987 | Hamby | ................ | H05K 3/4691 |
| | | | | | | 156/150 |
| 4,872,934 | A | * | 10/1989 | Kameda | .................. | B32B 38/10 |
| | | | | | | 156/250 |
| 5,313,416 | A | * | 5/1994 | Kimura | ............... | H01L 23/5387 |
| | | | | | | 257/E23.177 |
| 5,654,730 | A | * | 8/1997 | Tanaka | ................ | G02F 1/13452 |
| | | | | | | 345/87 |
| 5,736,780 | A | * | 4/1998 | Murayama | ............ | H01L 23/055 |
| | | | | | | 257/673 |
| 5,841,414 | A | * | 11/1998 | Tanaka | ................ | G02F 1/13452 |
| | | | | | | 345/206 |
| 6,054,664 | A | * | 4/2000 | Ariga | .................. | H01H 13/702 |
| | | | | | | 200/268 |

(Continued)

*Primary Examiner* — Xiaoliang Chen
(74) *Attorney, Agent, or Firm* — Rosenberg, Klein & Lee

(57) ABSTRACT

A power supply path structure is provided for a flexible circuit board and includes a first flexible circuit board that includes at least one first connection pad and a first opposite connection pad and a first power supply path connected between the first connection pad and the first opposite connection pad and a second flexible circuit board that includes at least one second connection pad and a second opposite connection pad and a second power supply path connected between the second connection pad and the second opposite connection pad. The first flexible circuit board is stacked, in a vertical direction, on the second flexible circuit board in such a way that the first power supply path and the second power supply path form a parallel-connected power supply path that serves as a power path or a grounding path for the first flexible circuit board.

7 Claims, 11 Drawing Sheets

(56) References Cited

U.S. PATENT DOCUMENTS

| | | | | |
|---|---|---|---|---|
| 6,469,377 B1 * | 10/2002 | Kondo | H01L 23/5382 | 257/686 |
| 6,504,244 B2 * | 1/2003 | Ichinose | H01L 23/4985 | 257/685 |
| 6,541,896 B1 * | 4/2003 | Piel, Jr. | B06B 1/0622 | 310/334 |
| 7,974,104 B2 * | 7/2011 | Kitada | H05K 3/363 | 174/254 |
| 2003/0067064 A1 * | 4/2003 | Kim | H01L 23/3114 | 257/686 |
| 2003/0173105 A1 * | 9/2003 | Kondo | H05K 3/4691 | 174/255 |
| 2004/0009334 A1 * | 1/2004 | Miyamoto | H01M 2/26 | 428/209 |
| 2005/0057906 A1 * | 3/2005 | Nakatani | H05K 3/321 | 361/771 |
| 2011/0094790 A1 * | 4/2011 | Lin | H05K 1/028 | 174/350 |
| 2011/0149533 A1 * | 6/2011 | Luo | G06K 19/07 | 361/751 |
| 2011/0188816 A1 * | 8/2011 | Uemura | G02B 6/36 | 385/88 |
| 2013/0155632 A1 * | 6/2013 | Lo | H05K 1/028 | 361/749 |
| 2013/0292050 A1 * | 11/2013 | Chiou | H05K 3/0064 | 156/252 |
| 2014/0085856 A1 * | 3/2014 | Shirao | H05K 1/0251 | 361/803 |

* cited by examiner

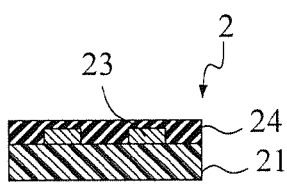
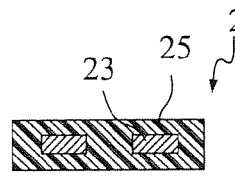
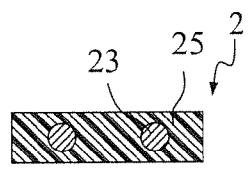
FIG.3A    FIG.3B    FIG.3C
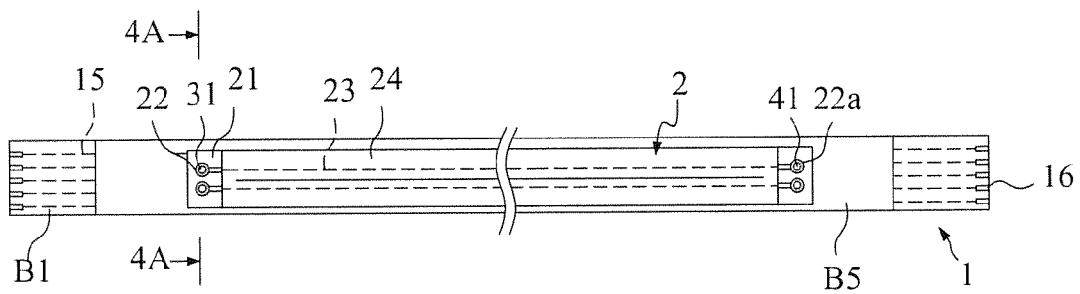
FIG.4
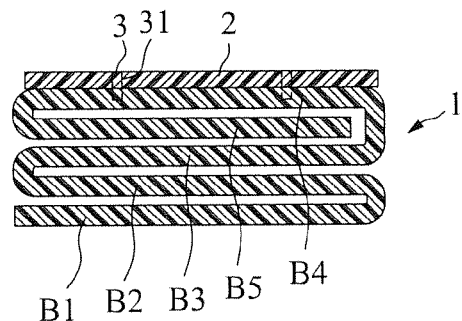
FIG.4A
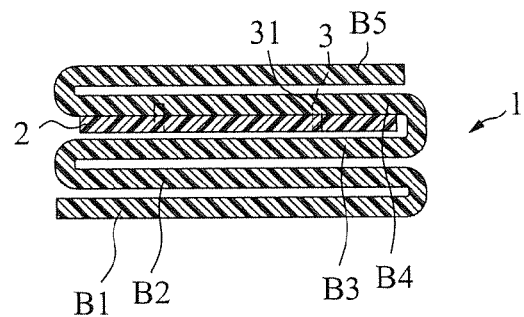
FIG.4B

POWER SUPPLY PATH STRUCTURE OF FLEXIBLE CIRCUIT BOARD

BACKGROUND OF THE INVENTION

1. Field of the Invention

The present invention relates to a structure of a flexible circuit board, and in particular to a power supply path structure of a flexible circuit board, which comprises a power path or a grounding path that allows for supply of enlarged rating power through the flexible circuit board.

2. The Related Arts

Flexible circuit boards have been widely used in all sorts of electronic products, especially those electronic products that are light and compact, such as consumer electronic products, including mobile phones, digital cameras, computer peripherals, flat displays, and game machines, all involving the use of the flexible circuit boards.

With the amount of signal transmission in an electronic product being increasingly enlarged, the number of signal transmission lines used is increased. On the other hand, with the need of having light and compact electronic products, the line width of conductive paths involved in a flexible circuit board is increasingly reduced.

To cope with such a new market nature of increasingly enlarging the number of signal transmission lines and increasingly reducing the line width of the conductive lines involved, most of the manufacturers adopt several common solutions, including increasing the number of the transmission lines used, increasing the number of signal transmission pins, and increasing widths of flexible circuit boards. Under such new demands in respect of the number of signal transmission lines and the line widths of the conductive paths, a new need of increasing supply of electrical power is emerging for all sorts of electronic products. It is thus a challenge of those involved in the art of flexible circuit board design to provide a power path and a grounding path that are capable of supplying sufficient electric power through a flexible circuit board; however, up to date, no manufacturers have proposed any design to provide a power path that is capable of supplying sufficient electric power therethrough.

SUMMARY OF THE INVENTION

Thus, an object of the present invention is to provide a power supply path structure of a flexible circuit board that provides a sufficient electrical power in a flexible circuit board.

The technical solution that the present invention adopts to achieve the above object is that at least two flexible circuit boards are stacked on each other to form a parallel-connected power supply path. Structurally, the present invention is arranged in such a way that a first flexible circuit board comprises at least one first connection pad and a first opposite connection pad and a first power supply path connected between the first connection pad and the first opposite connection pad and a second flexible circuit board comprises at least one second connection pad and a second opposite connection pad and a second power supply path connected between the second connection pad and the second opposite connection pad. The first flexible circuit board is stacked, in a vertical direction, on the second flexible circuit board in such a way that the first power supply path and the second power supply path form a parallel-connected power supply path that serves as a power path or a grounding path of the first flexible circuit board.

The second flexible circuit board comprises a first through hole formed in and extending through the second connection pad and a first electric conduction structure is deposited and fixed in the first through hole. The second flexible circuit board comprises a second through hole formed in and extending through the second opposite connection pad and a second electric conduction structure is deposited and fixed in the second through hole. The first electric conduction structure and the second electric conduction structure are each formed of one of silver, aluminum, copper, tin, conductive carbon paste, conductive-particle-contained adhesive.

The first flexible circuit board comprises a plurality of signal terminals or solder zones formed thereon.

The first flexible circuit board and the second flexible circuit board are each one of a single-sided board, a double-sided board, a multilayer board, and a rigid-flex board.

The first electric conduction structure and the second electric conduction structure each have a surface on which an insulation protection layer is formed.

The second flexible circuit board has a bottom that is opposite to a surface thereof and comprises a third power supply path structure formed thereon.

The first extension section of the first flexible circuit board further comprises at least one pair of differential mode signal paths for transmission of high-frequency differential mode signals.

In another embodiment of the present invention, the first extension section of the first flexible circuit board is slit in an extension section to form a plurality of slit lines, which divides the first extension section of the first flexible circuit board into a plurality of divided zones. The divided zones are foldable and stackable on each other to form a folded and stacked structure. The second flexible circuit board is arranged to correspond to and is stacked on one divided zone of the plurality of divided zones of the first flexible circuit board. The second flexible circuit board and the first flexible circuit board, after being stacked on each other, is looped by one of a looping member and a helical looping member that is wrapped around the first extension section of the first flexible circuit board for being put through a bore of a hinge structure.

The efficacy of the present invention is that when two or more flexible circuit boards are stacked on each other, electrical connection between connection pads and conductive lines of the flexible circuit boards can be formed through electrical conduction structures and power supply paths of the two or more flexible circuit boards are arranged to form a parallel-connected power supply path that serves as a power path or a grounding path of the flexible circuit boards. As such, a flexible circuit board having sufficient capability to supply electrical power is formed. Further, the parallel-connected power supply path may suit the demands for achieving signal transmission through a flexible circuit board that the number of signal transmission lines of a flexible circuit boards is increased, the width of the conductive lines is reduced, the demand of power is expanded, and the grounding path is enlarged.

Further, the first flexible circuit board can be arranged to include a plurality of divided zones, wherein the divided zones may be stacked on each other to form a folded and stacked structure and the second flexible circuit board may be stacked on one divided zone of the plurality of divided zone. Such a folded and stacked structure allows the first extension section of the first flexible circuit board to be readily put through a narrow hole or a bore of a hinge structure.

BRIEF DESCRIPTION OF THE DRAWINGS

The present invention will be apparent to those skilled in the art by reading the following description of preferred embodiments of the present invention, with reference to the attached drawings, in which:

FIG. 3A is a cross-sectional view illustrating the second flexible circuit board of FIG. 1 is formed of a flexible printed circuit (FPC);

FIG. 3B is a cross-sectional view illustrating the second flexible circuit board of FIG. 1 is formed of a flexible flat cable (FFC);

FIG. 3C is a cross-sectional view illustrating the second flexible circuit board of FIG. 1 is formed of a molding insulation circuit cable;

FIG. 4 is a schematic plan view showing the first flexible circuit board and the second flexible circuit board of FIG. 1, which after being stacked on each other, are further folded to present a reduced width;

FIG. 4A is a cross-sectional view taken along line 4A-4A of FIG. 4:

FIG. 4B is another cross-sectional view taken along line 4A-4A of FIG. 4;

DETAILED DESCRIPTION OF THE PREFERRED EMBODIMENTS

Figure 1:
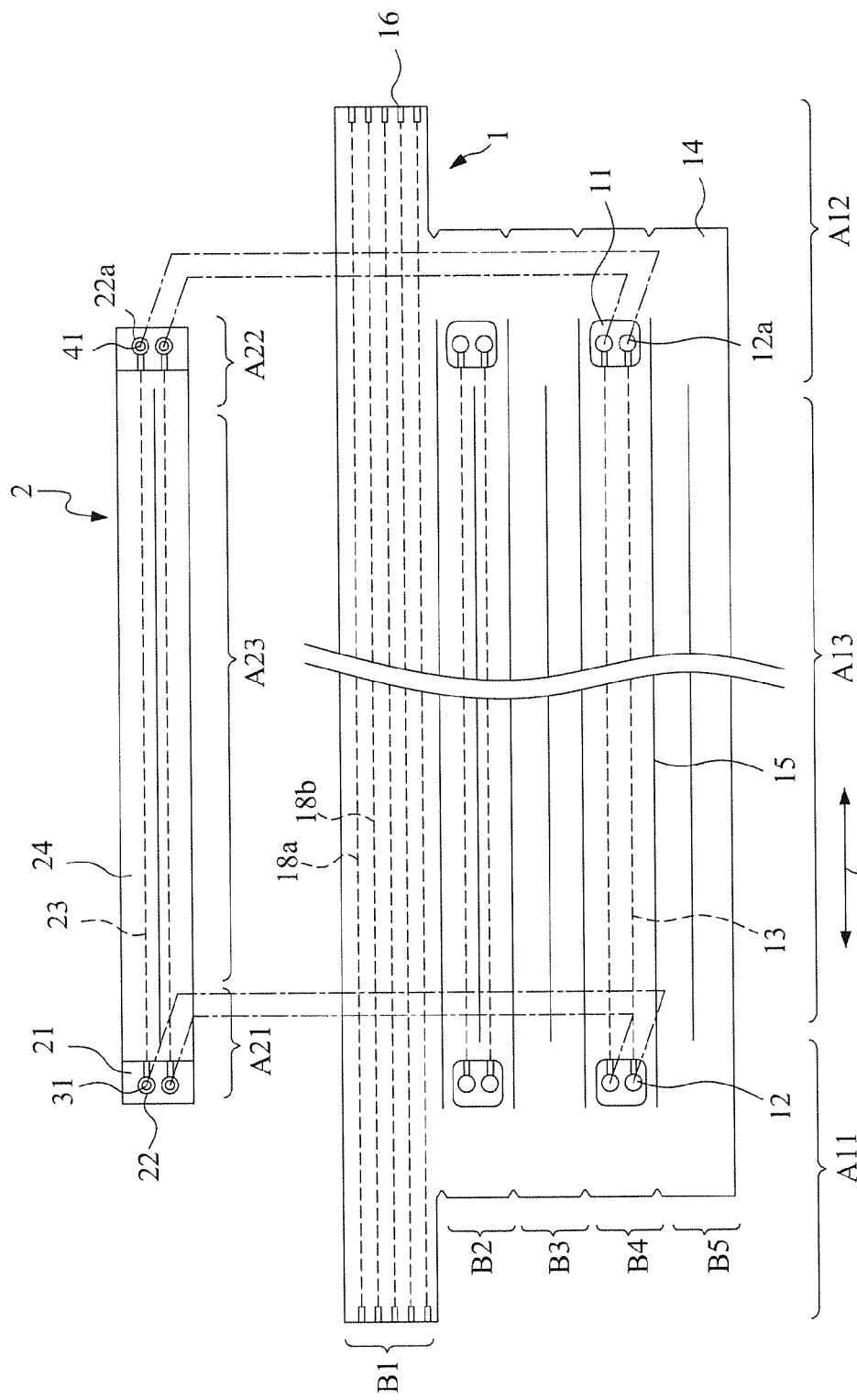
FIG. 1 is a schematic plan view of a power supply path structure of a flexible circuit board according to a first embodiment of the present invention, in a condition that a first flexible circuit board and a second flexible circuit board are separated from each other.

Referring to FIG. 1, a schematic plain view is given to show a power supply path structure of a flexible circuit board according to a first embodiment of the present invention in a condition that a first flexible circuit board 1 and a second flexible circuit board 2 are separated from each other.

As shown in the drawing, the first flexible circuit board 1 comprises a first connection section A11, a first opposite connection section A12, and a first extension section A13 connected between the first connection section A11 and the first opposite connection section A12 and extending in an extension section M1. The first flexible circuit board 1 is slit in the extension section M1 to form a plurality of slit lines 15, which allows the first flexible circuit board 1 to be folded to present a flat cable like structure having a reduced width or to be bunded to a clustered form.

The second flexible circuit board 2 comprises a second connection section A21, a second opposite connection section A22, and a second extension section A23 connected between the second connection section A21 and the second opposite connection section A22.

Figure 2A:
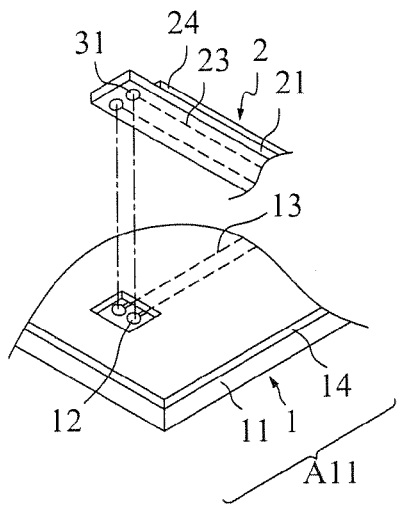
FIG. 2A is a perspective view illustrating a spatial relationship that a first connection pad of the first flexible circuit board of FIG. 1 is in alignment with and corresponds, in a vertical direction, to a first through hole of the second flexible circuit board.
Figure 2B:
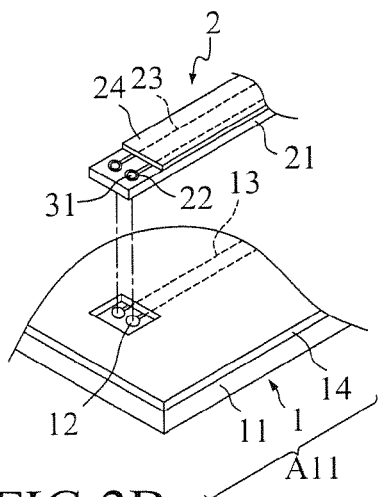
FIG. 2B is another perspective view illustrating the spatial relationship that the first connection pad o f the first flexible circuit board of FIG. 1 is in alignment with and corresponds, in a vertical direction, to the first through hole of the second flexible circuit board.
Figure 2C:
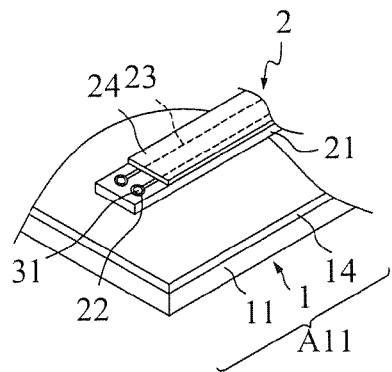
FIG. 2C is a perspective view showing a portion of the first flexible circuit board and the second flexible circuit board of FIG. 1 vertically stacked on each other.
Figure 5:
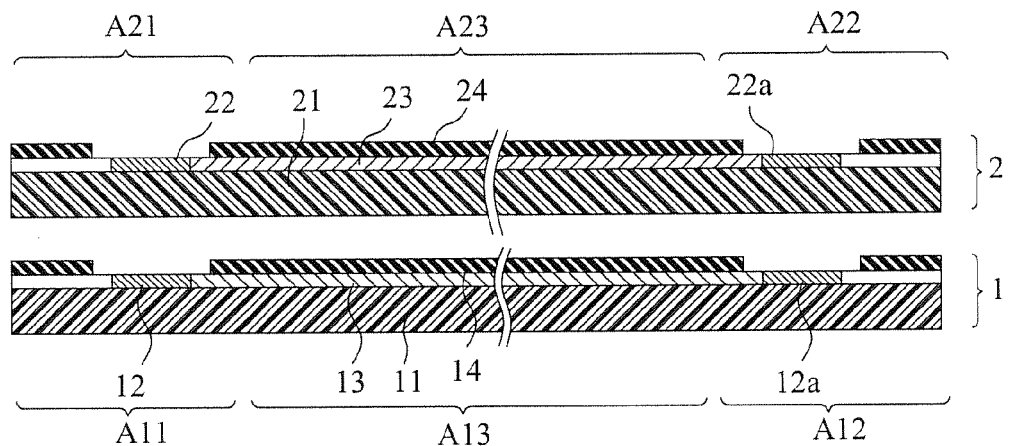
FIG. 5 is a cross-sectional view showing a first flexible circuit board and a second flexible circuit board of a first embodiment of the present invention are separated from each other.
Figure 6:
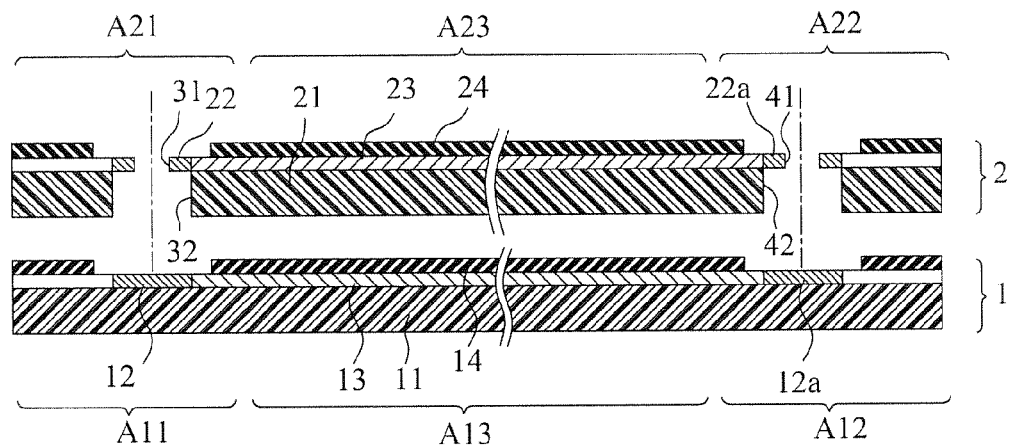
FIG. 6 is a cross-sectional view showing the first flexible circuit board and the second flexible circuit board of the first embodiment of the present invention are separated from each other and through holes are formed in the second flexible circuit board.
Figure 7:
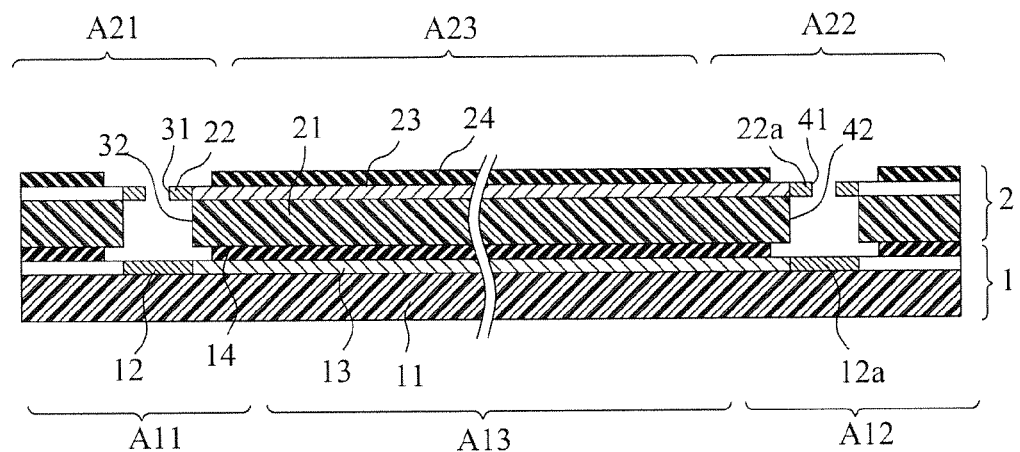
FIG. 7 is a cross-sectional view showing the first flexible circuit board and the second flexible circuit board of the first embodiment of the present invention are stacked on each other.

Also referring to FIGS. 2A-2C, FIG. 2A is a perspective view illustrating a spatial relationship that a first connection pad 12 of the first flexible circuit board 1 of FIG. 1 is in alignment with and corresponds, in a vertical direction, to a first through hole 31 of the second flexible circuit board 2;

FIG. 2B is another perspective view illustrating the spatial relationship that the first connection pad 12 of the first flexible circuit board 1 of FIG. 1 is in alignment with and corresponds, in a vertical direction, to the first through hole 31 of the second flexible circuit board 2; and FIG. 2C is a perspective view showing a portion of the first flexible circuit board 1 and the second flexible circuit board 2 of FIG. 1 vertically stacked on each other. The first flexible circuit board 1 includes a first substrate 11 and a first insulation layer 14 covering on the first substrate 11. The second flexible circuit board 2 includes a second substrate 21 and a second insulation layer 24 covering on the second substrate 21.

The second flexible circuit board 2 can be formed of various conductive line arrangements to achieve the purpose thereof. For example, FIG. 3A is a cross-sectional view illustrating the second flexible circuit board 2 of FIG. 1 is formed of a flexible printed circuit (FPC); FIG. 3B is a cross-sectional view illustrating the second flexible circuit board 2 of FIG. 1 is formed of a flexible Out cable; and FIG. 3C is a cross-sectional view illustrating the second flexible circuit board 2 of FIG. 1 is formed of a molding insulation circuit cable.

In a practical application of the present invention, the flexible circuit board of the present invention can be folded to present a folded configuration or a looped configuration in order to be receivable through a narrow space or a small hole. For example, FIG. 4 is a schematic plan view showing the first flexible circuit board 1 and the second flexible circuit board 2 of FIG. 1, which after being stacked on each other, are further folded to present a reduced width, whereby the first extension section A13 of the first flexible circuit board 1 is receivable through a narrow hole or a bore of a hinge structure.

As shown in FIG. 1, the first flexible circuit board 1 is slit with a plurality of slit lines 15 to divide the first extension section A13 of the first flexible circuit board 1 into a plurality of divided zones B1, B2, B3, B4, B5. In this way, the divided zones B1, B2, B3, B4, B5 can be folded along the slit lines 15 to get stacked on each other so that the first flexible circuit board 1 is foldable to show a folded and stacked circuit board structure. The final width of the first flexible circuit board 1 after folding is determined according to the sites where the slitting of the slit lines 15 is made so that the width of the first flexible circuit board 1 after folding can be equal to, larger than, or smaller than a width of the second flexible circuit board 2.

Regarding to the folded configuration so resulting, after the folding, the second flexible circuit board 2 can be located on the outermost surface of the folded configuration (as shown in FIG. 4A) or alternatively, the second flexible circuit board 2 can be sandwiched in the folded and stacked structure (as shown in FIG. 4B).

Referring to FIGS. 5-8, the first connection section A11 of the first flexible circuit board 1 comprises at least one first connection pad 12 and the first opposite connection section A12 comprises at least one first opposite connection pad 12a. The first connection pad 12 and the first opposite connection pad 12a are electrically connected to each other through a first power supply path 13 extending across the first extension section A13.

The second connection section A21 comprises at least one second connection pad 22 and the second opposite connection section A22 comprises at least one second opposite connection pad 22a. The second connection pad 22 and the second opposite connection pad 22a are electrically connected to each other through a second power supply path 23 extending across the second extension section A23.

The second flexible circuit board 2 is stacked, in the vertical direction, on the first flexible circuit board 1 in such a way that the second connection pad 22 of the second flexible circuit board 2 corresponds to the first connection pad 12 of the first flexible circuit board 1. Similarly, the second opposite connection pad 22a of the second flexible circuit board 2 corresponds to the first opposite connection pad 12a of the first flexible circuit board 1.

Figure 8:
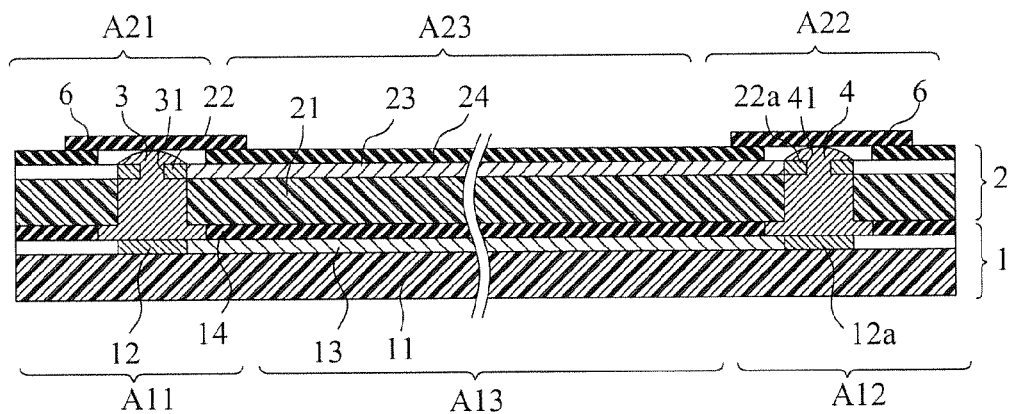
FIG. 8 is a cross-sectional view showing the first flexible circuit board and the second flexible circuit board of the first embodiment of the present invention are stacked on each other and are filled with electrical conduction structures.

In a preferred embodiment of the present invention, the second flexible circuit board 2 comprises a first through hole 31 formed in and extending through the second connection pad 22 in such a way that the first through hole 31 comprises an expanded hole wall 32 formed in the second flexible circuit board 2. The first through hole 31 comprises a first electric conduction structure 3 filled into and deposited and fixed therein (as shown in FIG. 8), so that the second connection pad 22 of the second flexible circuit board 2 is electrically connected through the first electric conduction structure 3 with the first connection pad 12 of the first flexible circuit board 1.

Further, the second flexible circuit board 2 comprise a second through hole 41 formed in and extending through the second opposite connection pad 22a in such a way that the second through hole 41 comprises an expanded hole wall 42 formed in the second flexible circuit board 2. The second through hole 41 comprises a second electric conduction structure 4 filled into and deposited and fixed therein so that the second opposite connection pad 22a of the second flexible circuit board 2 is electrically connected through the second electric conduction structure 4 with the first opposite connection pad 12a of the first flexible circuit board 1.

With the above-described structure, the first power supply path 13 and the second power supply path 23 are combined to form a parallel-connected power supply path, which serves as a power path or a grounding path of the first flexible circuit board 1.

Final, an insulation protection layer 6 may be additionally formed on a surface of each of the first electric conduction structure 3 and the second electric conduction structure 4.

The first electric conduction structure 3 and the second electric conduction structure 4 may each comprise one of silver, aluminum, copper, tin, conductive carbon paste, conductive-particle-contained adhesive.

Figure 9:
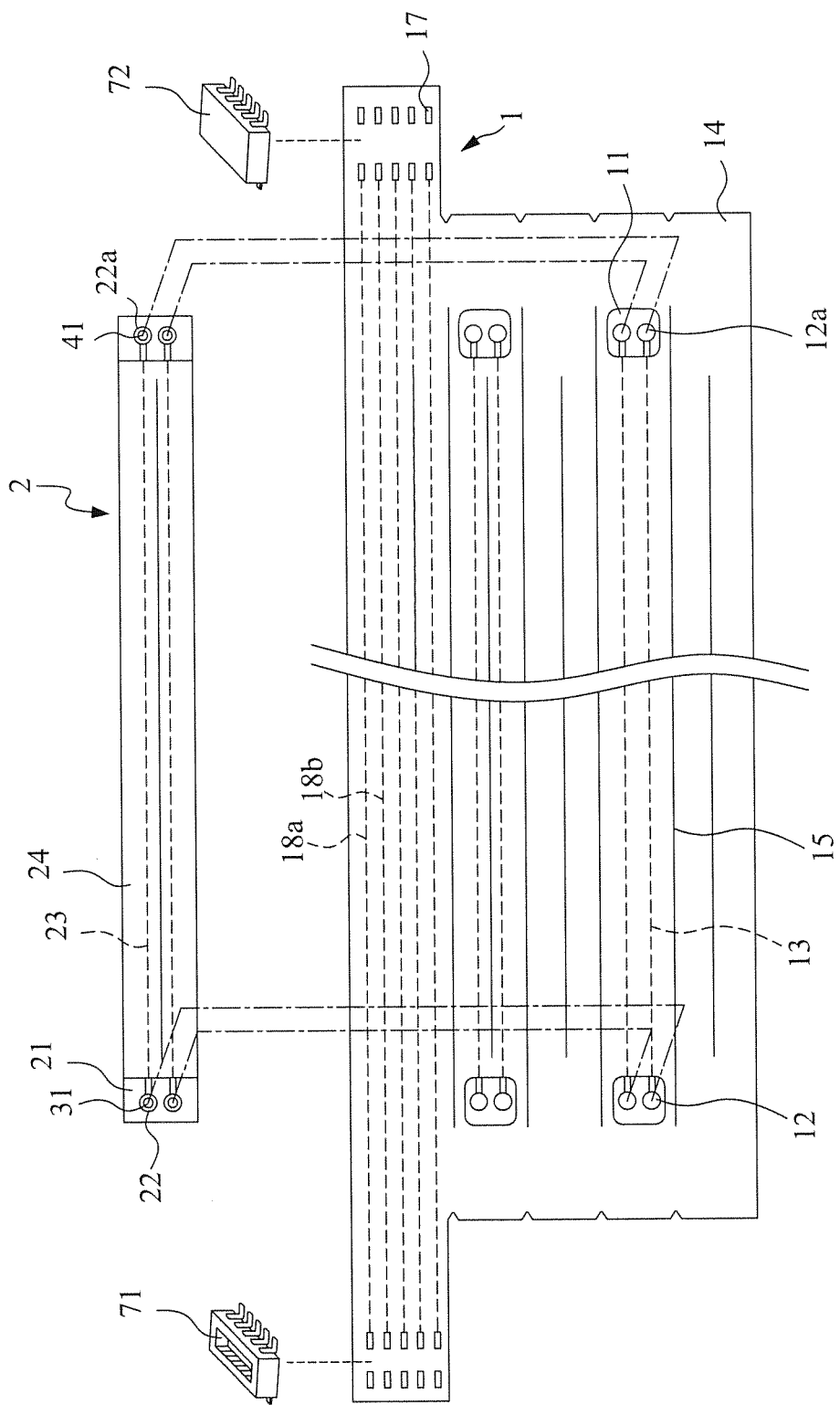
FIG. 9 is a schematic view showing solder zones are formed on a first connection section and a first counterpart section of the first flexible circuit board for providing electrical connectors or electronic components to be soldered on the solder zones.

As shown in the embodiment of FIG. 1, the first connection section A11 and the first opposite connection section A12 of the first flexible circuit board 1each comprise a plurality of signal terminals 16 formed thereon, or alternatively, the first connection section A11 and the first opposite connection section A12 of the first flexible circuit board 1 may each comprise a plurality of solder zones 17 formed thereon for providing a connector 71 or an electronic component 72 (shown in FIG. 9) to be soldered on the solder zones 17.

In a practical application, the first flexible circuit board 1 and the second flexible circuit board 2 may each be one of a single-sided board, a double-sided board, a multilayer board, and a rigid-flex board. The first extension section A13 of the first flexible circuit board 1 may comprise at least one pair of differential mode signal paths 18a, 18b, which are connected between the corresponding ones of the signal terminals 16 of the first connection section A11 and the first opposite connection section A12 for transmission of high-frequency differential mode signals.

As shown in the embodiment of FIG. 1, the first connection section A11 and the first opposite connection section A12 of the first flexible circuit board 1 are arranged in a configuration of being opposite to each other, but other configurations involving other arrangements of orientation may be adopted. For example, FIG. 10 is a schematic plan view showing the first flexible circuit board 1 of FIG. 1 is modified to comprise sideways arranged first connection section A11 and the first opposite connection section A12.

Figure 10:
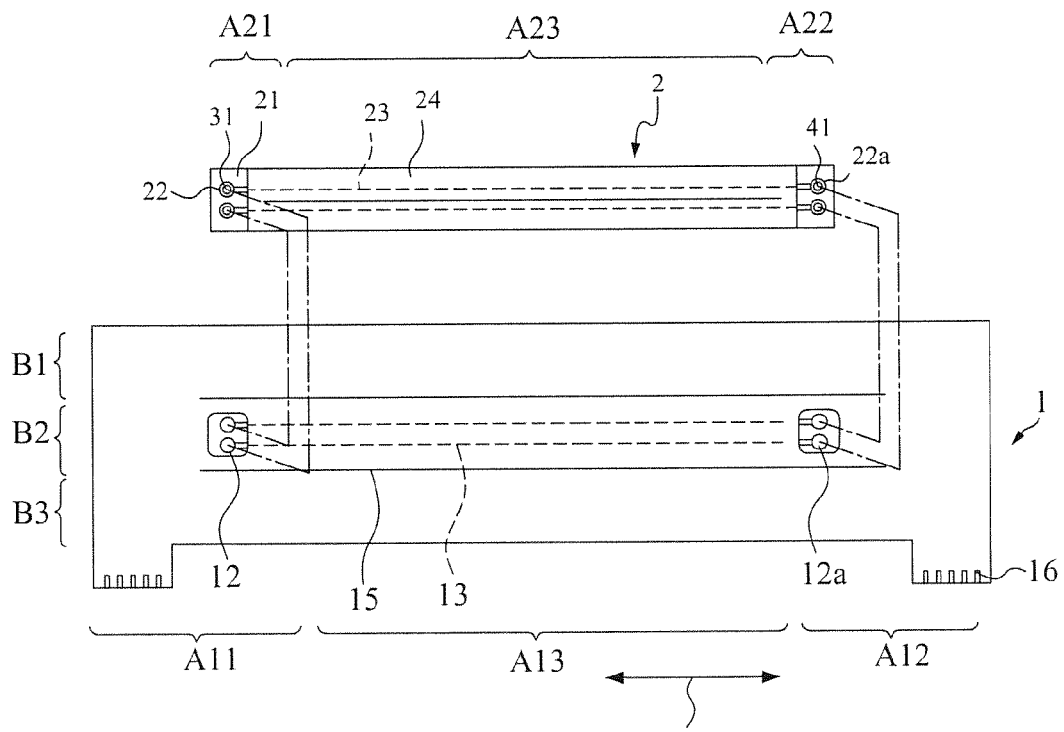
FIG. 10 is a schematic plan view showing a modified arrangement of the first flexible circuit board of FIG. 1 involving a first connection section and a second connection section of an alternative arrangement.
Figure 10A:
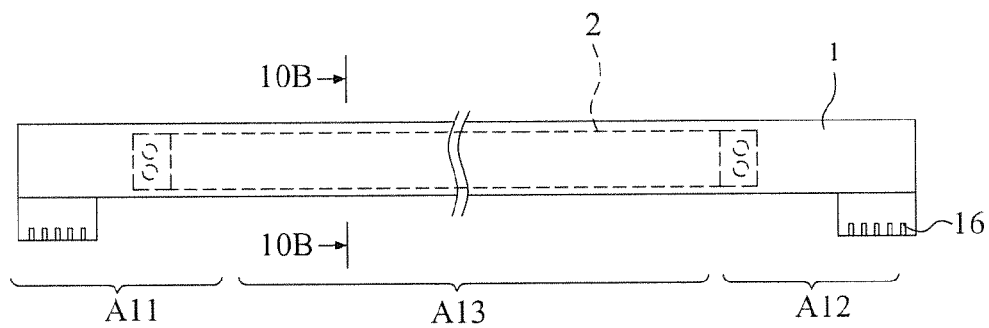
FIG. 10A is a schematic plan view showing the second flexible circuit board and the first flexible circuit board of FIG. 10, which after being stacked on each other, are further folded to present a reduced width.
Figure 10B:
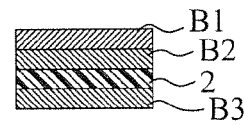
FIG. 10B is a cross-sectional view taken along line 10B-10B of FIG. 10A.

As shown in FIG. 10, the first extension section A13 of the first flexible circuit board 1 is slit in the extension section M1 to form a plurality of slit lines 15, so that the first extension section A13 of the first flexible circuit board 1 is divided into a plurality of divided zones B1, B2, B3. The divided zones B1, B2, B3 can be folded and stacked on each other to form a folded and stacked structure. FIG. 10A is a schematic plan view showing the second flexible circuit board 2 and the first flexible circuit board 1 of FIG. 10, which after being stacked on each other, are further folded to present a reduced width. FIG. 10B is a cross-sectional view taken along line 10B-10B of FIG. 10A.

Figure 10C:
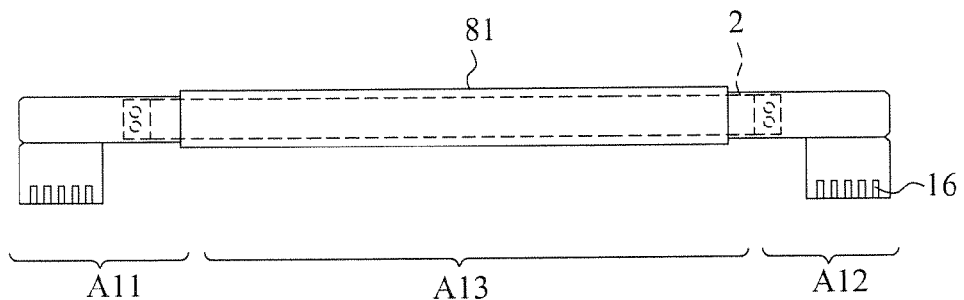
FIG. 10C is a schematic plan view showing the second flexible circuit board and the first flexible circuit board of FIG. 10A, which after being stacked on each other, are further looped with a looping member.
Figure 10D:
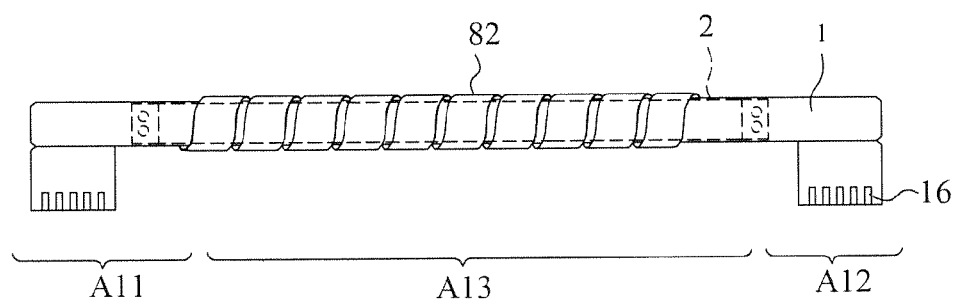
FIG. 10D is a schematic plan view showing the second flexible circuit board and the first flexible circuit board of FIG. 10A, which after being stacked on each other, are further looped with a helical looping member.

FIG. 10C is a schematic plan view showing the second flexible circuit board 2 and the first flexible circuit board 1 of FIG. 10A, which after being stacked on each other, are further looped with a looping member 81 wrapping around the first extension section A13 of the first flexible circuit board 1 and the second extension section A23 of the second flexible circuit board 2. FIG. 10D is a schematic plan view showing the second flexible circuit board 2 and the first flexible circuit board I of FIG. 10A, which after being stacked on each other, are further looped with a helical looping member 82 wrapping, in a helical direction, around the first extension section A13 of the first flexible circuit board 1 and the second extension section A23 of the second flexible circuit board 2.

Figure 10E:
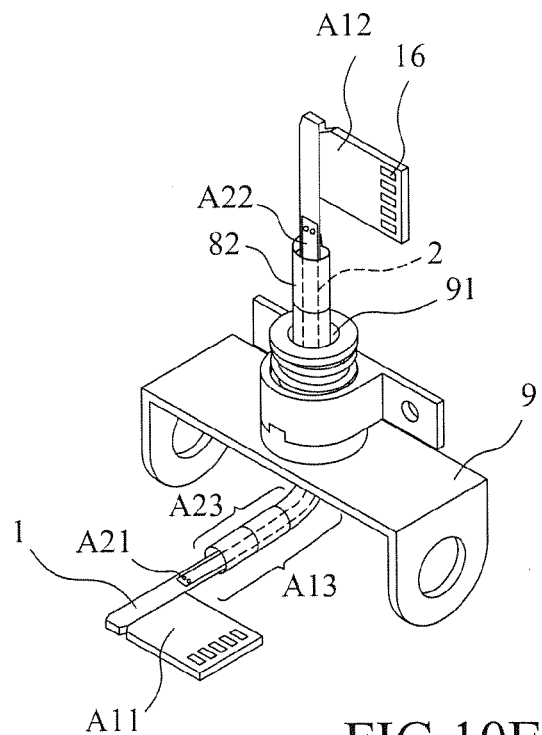
FIG. 10E is a perspective view showing the second flexible circuit board and the first flexible circuit board of FIG. 10A, which after being stacked on each other, are further put through a bore of a hinge structure.

FIG. 10E is a perspective view showing the first extension section A13 of the first flexible circuit board 1 and the second extension section A23 of the second flexible circuit board 2 of FIG. 10A, which after being stacked on each other, are put through a bore 91 of a hinge structure 9. T he first extension section A13 of the first flexible circuit board 1 and the second extension section A23 of the second flexible circuit board 2, which after being stacked on each other and looped with the helical looping member 82 as shown in FIG. 10D, may also put through the bore 91 of the hinge structure 9.

Figure 11:
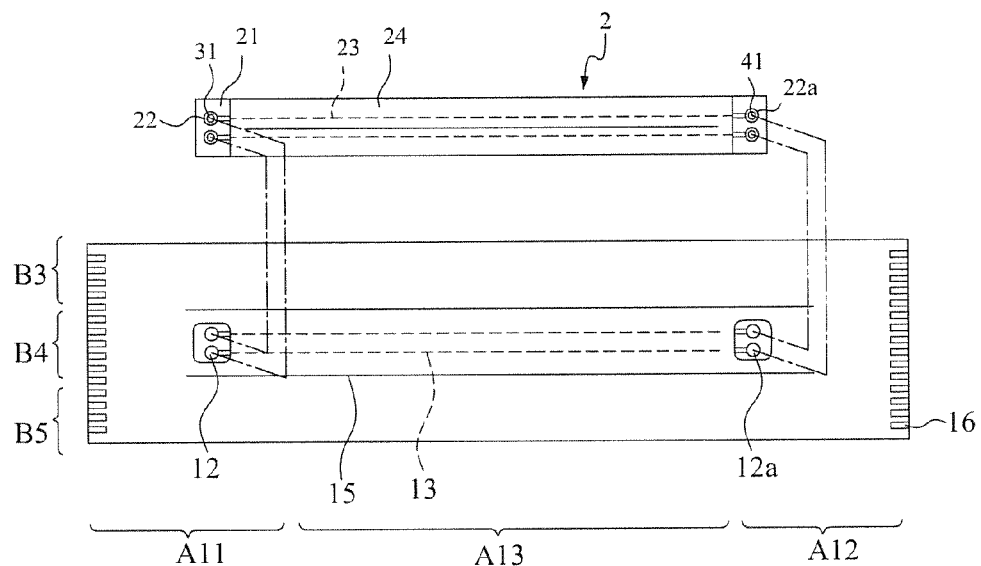
FIG. 11 is a schematic plan view showing the first flexible circuit board of FIG. 1 involves an extension section of an alternative arrangement.
Figure 11A:
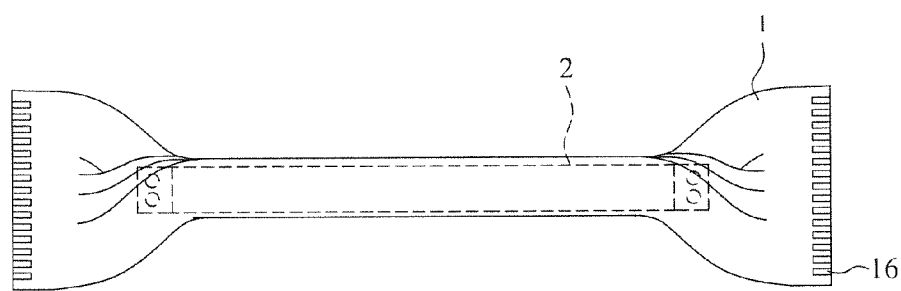
FIG. 11A is a schematic plan view showing the second flexible circuit board and the first flexible circuit board of FIG. 11, which after being stacked on each other, are further folded to present a reduced width.

FIG. 11 is a schematic plan view showing the first flexible circuit board 1 of FIG. 1 involves an extension section of an alternative arrangement. FIG. 11A is a schematic plan view showing the second flexible circuit board 2 and the first flexible circuit board 1 of FIG. 11, which after being stacked on each other, are further folded to present a reduced width.

Figure 12:
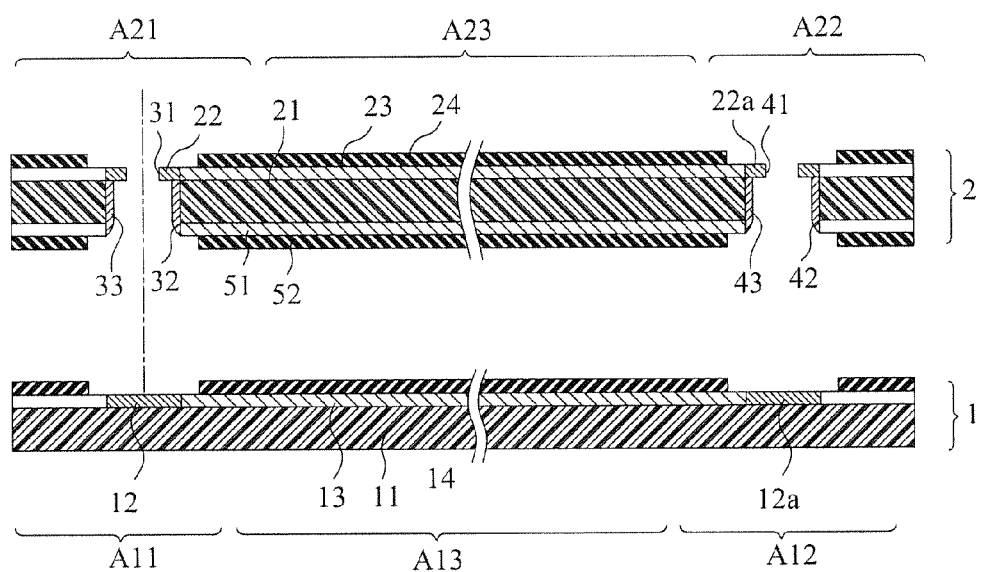
FIG. 12 is a cross-sectional view of a power supply path structure of a flexible circuit board according to a second embodiment of the present invention, in a condition that a first flexible circuit board and a second flexible circuit board are separated from each other.

Referring to FIG. 12, a cross-sectional plan view is given to illustrate a power supply path structure of a flexible circuit board according to a second embodiment of the present invention, in a condition that a first flexible circuit board 1 and a second flexible circuit board 2 are separated from each other. The constituent components of the instant embodiment are similar to those of the first embodiment and thus, similar components/parts/elements are designated with the same reference numerals for consistency. In the instant embodiment, the second flexible circuit board 2 has a bottom surface on which a third power supply path structure 51 is formed and a third insulation layer 52 is in turn formed on a bottom surface of the third power supply path structure 51. Further, the expanded hole wall 32 has an inner circumferential surface on which a hole-wall conductive layer 33 is formed and the expanded hole wall 42 has an inner circumferential surface on which a hole-wall conductive layer 43 is formed.

Figure 13:
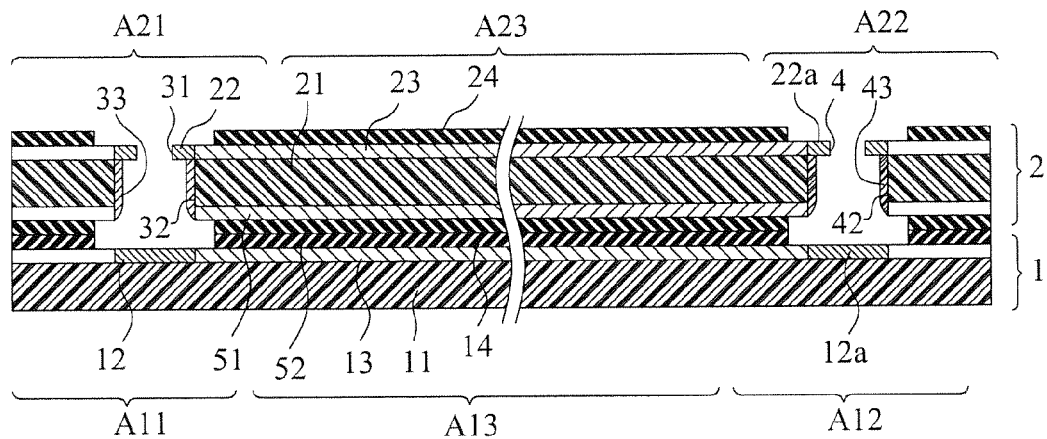
FIG. 13 is a cross-sectional view showing the first flexible circuit board and the second flexible circuit board of the second embodiment of the present invention stacked on each other.

FIG. 13 is a cross-sectional view showing the first flexible circuit board 1 and the second flexible circuit board 2 of the power supply path structure of the flexible circuit board according to the second embodiment of the present invention are stacked on each other in the vertical direction.

Figure 14:
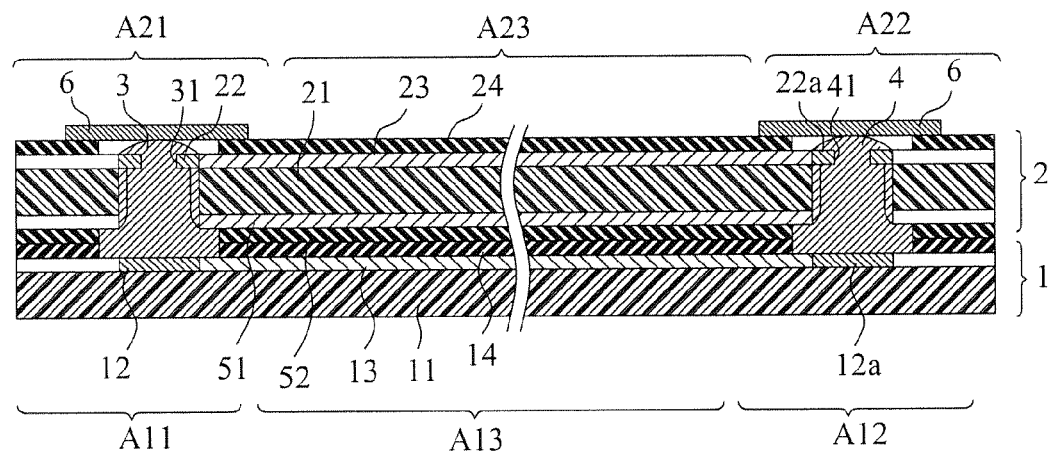
FIG. 14 is a cross-sectional view showing the first flexible circuit board and the second flexible circuit board of the second embodiment of the present invention are stacked on each other and are filled with electrical conduction structures.

Referring to FIG. 14, when the second flexible circuit board 2 is stacked, in the vertical direction, on the first flexible circuit board, the first electric conduction structure 3 is filled into and deposited and fixed in the first through hole 31 so that the second connection pad 22 of the second flexible circuit board 2 and the third power supply path structure 51 are electrically connected through the first electric conduction structure 3 with the first connection pad 12 of the first flexible circuit board 1.

Similarly, the second electric conduction structure 4 is filled into and deposited and fixed in the second through hole 41 so that the second opposite connection pad 22a of the second flexible circuit board 2 and the third power supply path structure 51 are electrically connected through the second electric conduction structure 4 with the first opposite connection pad 12a of the first flexible circuit board 1.

The embodiments described above are respectively given for illustration with applications of the present invention to a single-sided and a double-sided board, but the present invention is not limited to them. The first flexible circuit board 1 and the second flexible circuit board 2 of the present invention can each be one of a single-sided board, a double-sided board, a multilayer board, and a rigid-flex board. The multilayer board can be a combination of multiple single-sided boards or a combination of multiple double-sided boards or a combination of multiple single-sided boards and multiple double-sided boards. The rigid-flex board can be a combination of a flexible circuit board and a rigid circuit board.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A power supply path structure of a flexible circuit board, comprising:
    a first flexible circuit board comprising a first connection section, a first opposite connection section, and a first extension section connected between the first connection section and the first opposite connection section and extending in an extension section, wherein the first flexible circuit board has a first surface comprising at least one first connection pad formed thereon in the first connection section and at least one first opposite connection pad formed thereon in the first opposite connection section and the first connection pad and the first opposite connection pad are electrically connected to each other through a first power supply path extending across the first extension section; and
    a second flexible circuit board comprising a second connection section, a second opposite connection section, and a second extension section connected between the second connection section and the second opposite connection section, wherein the second flexible circuit board has a second surface comprising at least one second connection pad formed thereon in the second connection section and at least one s econd opposite connection pad formed thereon in the second opposite connection section and the second connection pad and the second opposite connection pad are electrically connected to each other through a second power supply path extending across the second extension section;
    wherein the second flexible circuit board is arranged to correspond to and is stacked on the first flexible circuit board;
    the second connection pad of the second flexible circuit board corresponds to the first connection pad of the first flexible circuit board and the second connection pad is electrically connected through a first electric conduction structure with the first connection pad;

the second opposite connection pad of the second flexible circuit board corresponds to the first opposite connection pad of the first flexible circuit board and the second opposite connection pad is electrically connected through a second electric conduction structure with the first opposite connection pad; and the first power supply path and the second power supply path form a parallel-connected power supply path for the flexible circuit board.

2. The power supply path structure as claimed in claim 1, wherein:

the second flexible circuit board comprises a first through hole formed in and extending through the second connection pad and the first electric conduction structure is deposited and fixed in the first through hole; and the second flexible circuit board comprises a second through hole formed in and extending through the second opposite connection pad and the second electric conduction structure is deposited and fixed in the second through hole;

wherein the first electric conduction structure and the second electric conduction structure are each formed of one of silver, aluminum, copper, tin, conductive carbon paste, conductive-particle-contained adhesive.

3. The power supply path structure as claimed in claim 1, wherein the first connection section and the first opposite connection section of the first flexible circuit board each comprises a plurality of solder zones formed thereon for providing one of a connector and an electronic component to be soldered on the solder zones.

4. The power supply path structure as claimed in claim 1, wherein the first flexible circuit board and the second flexible circuit board are each one of a single-sided board, a double-sided board, a multilayer board, and a rigid-flex board.

5. The power supply path structure as claimed in claim 1, wherein the first electric conduction structure and the second electric conduction structure each has a top surface on which an insulation protection layer is formed.

6. The power supply path structure as claimed in claim 1, further comprising a third power supply path structure formed on a bottom surface of the second flexible circuit board.

7. The power supply path structure as claimed in claim 1, wherein the first extension section of the first flexible circuit board further comprises at least one pair of differential mode signal paths.

* * * * *